Feb. 18, 1964 F. H. STEPHENS, JR 3,121,807
TRANSISTOR PULSE SHAPING AND AMPLIFYING CIRCUIT
Filed April 11, 1960
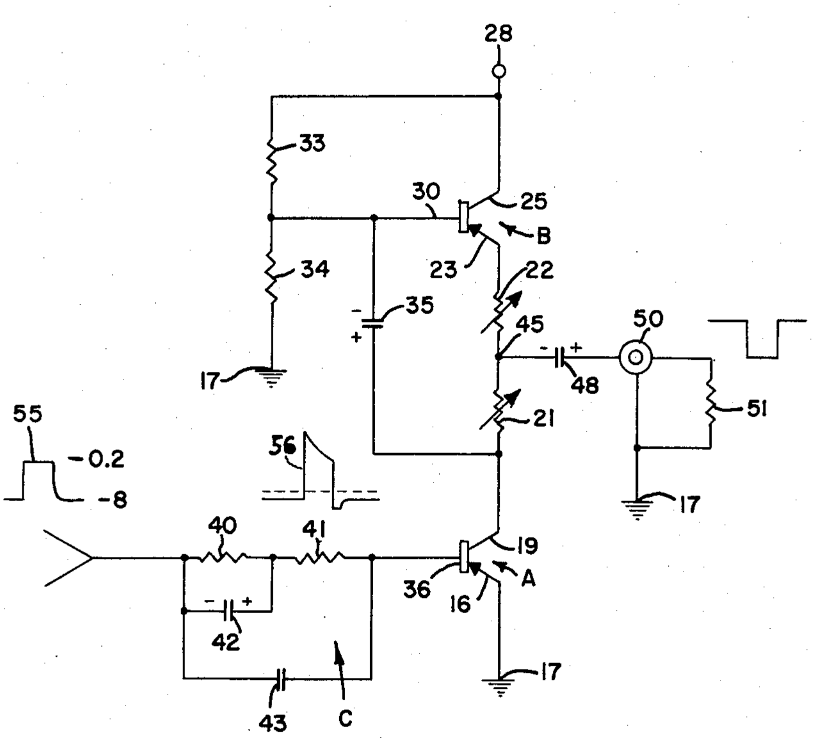
INVENTOR
Frank H. Stephens, Jr.
BY Townsend and Townsend
attorneys 3,121,807

TRANSISTOR PULSE SHAPING AND AMPLIFYING CIRCUIT

Frank H. Stephens, Jr., 9001 SW. 64th Court, Miami, Fla., assignor of one-third each to Vernand M. Hanson and Robert A. Oswald, both of Los Angeles, Calif.

Filed Apr. 11, 1960, Ser. No. 21,463
7 Claims. (Cl. 307—88.5)

This invention relates to a current amplifier employing semi-conductor devices.

In many electronic applications it is necessary to convert the relatively high impedance signal source containing sequential pulses of substantially square waveforms and feed the signals or pulses through a relatively low impedance line. In order to accomplish this function it is generally necessary to employ some form of current or power amplifier which will provide a signal output matched in impedance with the transmission line. The output signal, of course, must have the characteristics necessary to drive the equipment on the opposite end of the line. This generally requires that the pulse output have extremely rapid rise and fall times and that there be minimal fluctuation in values between the rise and fall of the pulse. In other words, the most satisfactory pulse is a substantially square waveform. It is well known that an exact square waveform is almost impossible to obtain and therefore as a compromise it is desirable that a deviation from the strict rectangular waveform configuration be completely symmetrical.

It has been difficult in the past to provide a semi-conductor power amplifier for accomplishing the above functions. This is due to a storage effect which exists in transistors when the transistor is changed from one of its conditions of conductivity to the other. The proper application of current to a PNP transistor will cause the transistor almost immediately to go into a conductive or low impedance condition. However, the reverse is not true because there is a capacitive or hole storage effect which creates a condition which tends to resist a rapid change of state to the high impedance condition. Thus, if a transistor were employed as a straight amplifier where the transistor was being driven between conductive and non-conductive conditions the output pulse would be sharp on one edge and quite irregular and curved on the other edge. This would be an unacceptable output for many applications.

It is the principal object of the present invention to provide a unique device employing two transistors mounted across a constant voltage D.C. source in which the load of the two transistors are connected in series and in which the output signal is taken at the junction of the loads. Each transistor in the circuit is operative when moved in the fast direction to cause an immediate effect at the output terminal through its respective load. The input signal is directly applied only to one of the transistors, called the driving transistor, and the other transistor, called the driven transistor, is coupled to the driving transistor in such a way that the driven transistor will be driven in its fast direction during the interval when the driving transistor is being driven in the slow direction. By means of this circuit, therefore, the driving transistor is primarily responsible for one edge of the output pulse and the driven transistor is primarily responsible for the opposite edge of the output pulse.

A feature and advantage of this invention is that two transistors compensate for the hole or capacitive storage characteristics inherent in transistor action so that the transistors can be driven between the extremities of high and low impedance conditions and still provide a substantially symmetrical output signal.

Another feature and advantage of this invention is that there is substantially uniform bidirectional internal impedance so that a substantially square wave input to the amplifier will result in a substantially square wave output. The amplifier also has a feature and advantage of providing a limiting or clipping function which tends to create more symmetrical pulses at the output than are available at the input end of the amplifier.

A further feature and advantage of this invention is that the amplifier will convert signals from a relatively high impedance source to a relatively low impedance output in which the output impedance is a function solely of the load impedance and the internal resistance of the transistors. For this reason the output impedance can be almost pure resistance if desired.

The circuit also has the advantage of being adjustable to precisely match with low impedance transmission lines so as to create a condition where the circuit will function to absorb secondary signal reflections which may exist because of a mismatching of impedance at the opposite ends of the lines.

Another object of this invention is to provide a novel transistor pulse amplifying circuit which can use identical type transistors having the same basic characteristics relative to fluctuations under variations of ambient conditions, current and voltage stresses, radiation and other influencing factors.

Other objects of the present invention will become apparent upon reading the following specification and referring to the accompanying drawings in which similar characters of reference represent corresponding parts in each of the several views.

In the drawing there is provided a schematic diagram showing the principal embodiment of the invention in which the circuit employs PNP type transistors and in which the pulse input is arranged to go from a minus to a substantially less minus value.

The power amplifier and clipper circuit of this invention generally comprises a driving transistor A and a driven transistor B.

Driving transistor A comprises an emitter 16 connected to ground at 17 and a collector 19 connected to a load impedance or resistance 21 which in turn is connected to a load resistance or impedance 22 for driven transistor B. Resistance 22 is therefore connected directly to emitter 23 of the driven transistor.

Collector 25 of the driven transistor is connected to a constant voltage source of power at 28 which may be, for example, a 10 volt power source having the minus terminal connected at 28 and the positive terminal connected at ground 17.

The base of driven transistor B is biased by a resistance dividing network in which the base is connected to the junction of two resistors 33 and 34. Resistor 33 is connected to the negative power terminal 28 and resistor 34 is connected to ground. Resistors 33 and 34 are selected in value so that the base is biased at a potential of approximately one-half the power source, i.e., —5 volts.

The output of the driving transistor is coupled to the input transistor by an electrolytic capacitor 35 which is connected directly to collector 19 of the driving transistor and base 30 of the driven transistor.

The input signal into base 36 of driving transistor A is modified to sharpen the input pulse to provide a substantially sharper and more intensified leading and trailing edge. This is done by providing an RC network C comprising two series connected resistors 40 and 41 with a capacitor 42 connected across resistor 40 and a capacitor 43 connected across both resistors 40 and 41.

The aforesaid RC circuit C merely functions as a wave shape or peaking network which also provides a steady state bias and is effective in shaping a pulse such as indicated at 55 to provide the more extreme rise and fall times as indicated at 56.

The output is taken at the junction 45 of the two load resistances or impedances 21 or 22 and is fed through a coupling condenser 48 to a terminal connector 50 into which the transmission line or load 51 can be connected.

In operation it can be seen that the output signal to condenser 48 is the product of the voltage drop across transistor A and load 21 and across transistor B and load 22. Thus when transistor A is in the conductive condition and transistor B is in the non-conductive condition the greater current flow will be through load 21 and when the the reverse condition exists, i.e., when transistor B is in the conductive condition and transistor A is in the non-conductive condition, the greater current flow will be through load 22.

In the circuit as illustrated, driving transistor A is normally biased in the conductive condition so that the leading edge of an input pulse when imposed upon base 36 will cause transistor A to go from the conductive to the non-conductive condition. The inherent storage effect within the transistor, however, will resist a rapid change from the conductive to the non-conductive condition. However, as transistor A, the driving transistor, goes to the non-conductive state there is a change in potential across capacitor 35 which is coupled by the capacitor to base 30 of driven transistor B. Normally transistor B had been been held in the non-conductive condition by virtue of the combined bias through resistors 33 and 34 and the stored energy on capacitor 35. Therefore, when there is a change in the voltage drop across resistance 21 there is a reverse charge provided on capacitor 35 which is coupled to base 30 in such a way to cause the base to be driven to a more negative region. Therefore, driven transistor B will rapidly go from its non-conductive to conductive state and this happens at a rate substantially more rapid than the driving transistor can go from its conductive to non-conductive state due to the fact that the driving transistor is being driven in its fast direction.

When driven transistor B goes into high conductivity, the rapid change of the output signal will be primarily the result of the decreasing voltage drop across load resistance 22 and transistor B and only supplemented by the increasing voltage drop across resistance 21 and transistor A which is the slower of the two to change conditions. In this manner the phasing of the change of conductivity of the two transistors supplement each other to produce a substantially square symmetrical leading edge of the output pulse.

The trailing edge of the input pulse will cause base 36 of driving transistor A to be driven in the relatively high negative region and will cause the transistor to be rapidly driven in its fast direction from the non-conductive to the conductive state and at the same time will provide a signal across capacitor 35 to base 30 of driven transistor B which will cause transistor B to return to its non-conductive condition. Here again at the instant the transistor A goes into the conductive condition the greater current will flow through load resistance 21 so that the trailing edge of the output pulse will also exhibit the required symmetrical substantially square wave output. Thus the two waveforms provided by the joint action of each of the transistors together complement in the output of the amplifier as seen across the two load resistances 21 and 22.

It can be seen that during each complete cycle occurred by the introduction of a pulse each transistor contributes to the fast rise and fall time of the output signal to provide a substantially symmetric output waveform.

It has been observed that the pulse output from this amplifier has symmetric rise and fall waveforms which represent S-curves at an extremely rapid rate so as to normally appear, when observed on an oscilloscope, as substantially vertical unless expanded to extreme limits in the horizontal direction.

Driven transistor B accelerates the rise portion of the first part of the waveform and driving transistor A accelerates the sharpness of the fall portion of the wavefrom. The peaked waveform afforded at the input into the base of driving transistor A tends to accentuate the sharpness of the change of conductivity of the circuit.

It can be seen that the two transistors A and B are operated relatively either in a high condition of conductivity or at a low condition of conductivity so that their total internal impedance remains substantially constant. Load resistances 21 and 22, therefore, may be adjusted to allow for a wide range of output impedance. For example, the circuit is particularly suitable for input into a 75 ohm line. The output impedance is equal to the internal impedance of the conductive transistor plus the impedance value of its associated load impedance. The specific impedance of the circuit can be minutely adjusted to precisely match any line or load that is connected to the circuit. Adjustment of the output impedance can be obtained, for example, by employing variable resistances at 21 and 22. Although the impedance in the circuit is shown as being substantially pure resistance it is believed obvious that the resistances 21 and 22 can be replaced with other forms of impedance if such is desired.

The polarity conditions specified are all in reference to PNP type transistors. It is to be understood that in the event that NPN type transistors are employed that reverse polarity conditions would exist.

Although the foregoing invention has been described in some detail by way of illustration and example for purposes of clarity of understanding, it is to be understood that certain changes and modifications may be practiced within the spirit of the invention as limited only by the scope of the appended claims.

What is claimed:

1. An amplifier for converting high impedance pulse information into relatively low output impedance pulse information, comprising: a first and second transistor; means biasing said first transistor to function as an amplifier; means biasing said second transistor to function as an amplifier; output load means for said first transistor and an output load means for said second transistor; said output load means being connected in series to provide an output terminal at the juncture of said loads; means applying pulses having a leading and trailing edge to said first transistor; one of said pulse edges responsive to cause said first transistor to go from a conductive to a non-conductive condition; the other of said pulse edges responsive to cause said first transistor to go from a non-conductive to a conductive condition; and means coupled to the input of said second transistor and to the output of said first transistor responsive to drive said second transistor into a non-conductive state when said first transistor is driven to the conductive state and to drive said second transistor to the conductive state when said first transistor is driven to the non-conductive state.

2. In a power amplifier of the type adapted to convert a relatively high impedance pulse input into a relatively low impedance pulse output the combination of: an output terminal; a first transistor; means biasing said first transistor to cause said transistor to function as an amplifier; an impedance load connected to the output of said first transistor and to said output terminal; a second transistor; means biasing said second transistor to function as an amplifier; an impedance load connected to the output of said second transistor and to said output terminal; means supplying pulses having a substantially sharp leading and trailing edge and having sufficient amplitude to bias said first transistor in a conductive condition in response to current supplied by one of the edges of said pulses and to go into a low impedance condition in response to current supply from the other of the edges of said pulses; and means connected to the output of said first transistor and the input of said second transistor responsive to fluctuate in the voltage drop across the impedance load of said first transistor to bias said second transistor in a non-conductive condition when said first transistor is in the conductive condition and to bias the second transistor in the conductive condition when said first transistor is in the non-conductive condition.

3. In an amplifier the combination of: a pair of semi-conductor devices; each said semi-conductor device having an emitter, a base and a collector; a pair of series connected impedance elements connected at opposite ends to the collector of the first said semi-conductor device and the emitter of the second said semi-conductor device; a source of constant direct current potential connected to the emitter of the first said semi-conductor device and the collector of the second said semi-conductor device; capacitive means interconnecting the collector of the first said semi-conductor device to the base of the second said semi-conductor device to pass current flow to the base of the said second semi-conductor device in proportion to the voltage appearing at the collector of the first said semi-conductor device; means driving the base of the first said semi-conductor device with pulse information; and means connected at the juncture between said impedance elements to establish an output terminal for the amplifier.

4. In an amplifier the combination of: a pair of semi-conductor devices; each said semi-conductor device having an emitter, a base and a collector; a pair of series connected impedance elements connected at opposite ends to the collector of the first said semi-conductor device and the emitter of the second said semi-conductor device; a source of constant direct current potential connected to the emitter of the first said semi-conductor device and the collector of the second said semi-conductor device; means biasing the base of said second semi-conductor device at a voltage point substantially midway between the voltage appearing on the collector of the first semi-conductor device and the emitter of the second semi-conductor device; capacitive means interconnecting the collector of the first said semi-conductor device to the base of the second said semi-conductor device to pass current flow to the base of the said second semi-conductor device in proportion to the voltage appearing at the collector of the first said semi-conductor device; means driving the base of the first said semi-conductor device with pulse information; and a load connected to the juncture between said impedance element and the emitter of said first semi-conductor element.

5. A device according to claim 4 and wherein the impedance value of one of said first and second impedance elements in combination with the impedance between collector and emitter of its associated semi-conductor device while in a low impedance condition equals the load impedance.

6. A device according to claim 4 and wherein means are provided associated with the means driving the base of the first semi-conductor device to shape the pulses applied to the base of said first semi-conductor device providing sharp rise and fall rates.

7. In an amplifier the combination of: a first transistor; said first transistor having a base, an emitter and a collector; a second transistor; said second transistor having a base, an emitter and a collector; first and second resistance means connected in series connecting the emitter of said second transistor with the collector of said first transistor; a source of direct current potential connected to the collector of said second transistor and the emitter of said first transistor; capacitive means connected to the base of said second transistor and the collector of said first transistor; and an output terminal connected between said first and second resistance means.

References Cited in the file of this patent

UNITED STATES PATENTS

| | | |
|---|---|---|
| 2,436,891 | Higinbotham | Mar. 2, 1948 |
| 2,730,576 | Caruthers | Jan. 10, 1956 |
| 2,928,009 | Powell | Mar. 8, 1960 |